United States Patent [19]

Galbraith et al.

[11] Patent Number: 5,017,813
[45] Date of Patent: May 21, 1991

[54] INPUT/OUTPUT MODULE WITH LATCHES

[75] Inventors: Douglas C. Galbraith, Fremont; Jonathan W. Greene, Palo Alto, both of Calif.

[73] Assignee: Actel Corporation, Sunnyvale, Calif.

[21] Appl. No.: 522,389

[22] Filed: May 11, 1990

[51] Int. Cl.$^5$ .............................................. H04Q 1/00
[52] U.S. Cl. .................................... 307/475; 307/473; 307/243; 307/465; 307/272.2
[58] Field of Search ............... 307/473, 475, 243, 465, 307/272.2

[56] References Cited

U.S. PATENT DOCUMENTS

| | | | |
|---|---|---|---|
| 4,683,384 | 7/1987 | Shibata et al. | 307/475 |
| 4,697,107 | 9/1987 | Haines | 307/475 |
| 4,709,173 | 11/1987 | Nishimichi et al. | 307/243 |
| 4,717,912 | 1/1988 | Harvey et al. | 307/465 |
| 4,745,305 | 5/1988 | Crafts | 307/475 |
| 4,896,296 | 1/1990 | Turner et al. | 307/465 |
| 4,903,223 | 2/1990 | Norman et al. | 307/465 |
| 4,912,345 | 3/1990 | Steele et al. | 307/465 |

*Primary Examiner*—Stanley D. Miller
*Assistant Examiner*—Scott A. Ouellette

[57] ABSTRACT

An input/output module circuit for providing input/output interface functions in integrated circuits includes an input section and an output section electrically connected to an I/O pad of the integrated circuit. The input section includes an input buffer/level shifter for translating the logic signals from the outside world to CMOS compatible levels. The input buffer may be placed in a high impedance state by a control signal applied to a control input. The output of the input buffer/level shifter is connected to a first data input of a two-input multiplexer. The output of the two-input multiplexer is connected to an internal bus and to the second data input of the two-input multiplexer. The select input of the two-input multiplexer is connected to a control signal, preferably to the same control signal used to enable the input buffer/level shifter. The output section of the input/output module section of the present invention includes a two-input multiplexer having a first input connected to an internal data bus, and its output fed back to its second data input. Its select input is driven from a control signal. The output of the two-input multiplexer is also connected to the input of an HCT buffer. The output of the HCT buffer is connected to an I/O pad of the integrated circuit, which may be the same pad to which the input section is connected. The slew input of the HCT buffer is driven from a signal enabling slow or fast rise times. The enable input of the HCT buffer is driven from an enable signal which may be derived from other logic signals.

3 Claims, 1 Drawing Sheet

INPUT/OUTPUT MODULE WITH LATCHES

BACKGROUND OF THE INVENTION

1. Field of the Invention

The present invention relates to digital electronic circuits. More specifically, the present invention relates to circuits for providing input/output interface functions in integrated circuits, and particularly for providing input/output interface functions in user-configurable integrated circuits.

2. The Prior Art

Circuits are known in the prior art for providing input/output interface functions in integrated circuits. Examples of such circuits include the circuits disclosed and claimed in U.S. Pat. No. 4,717,912 to Harvey et al. In addition, the X3000 family of programmable devices manufactured by Xilinx are known to have registered or direct outputs and slew rate control.

BRIEF DESCRIPTION OF THE INVENTION

An input/output module circuit for providing input/output interface functions in integrated circuits includes an input section and an output section electrically connected to an I/O pad of the integrated circuit. The input section includes an input buffer/level shifter for translating the logic signals from the outside world to CMOS compatible levels. The input buffer may be placed in a high impedance state by a control signal applied to a control input. The output of the input buffer/level shifter is connected to a first data input of a two-input multiplexer. The output of the two-input multiplexer is connected to an internal bus and to the second data input of the two-input multiplexer. The select input of the two-input multiplexer is connected to a control signal, preferably to the same control signal used to enable the input buffer/level shifter. This interconnection allows the two-input multiplexer to be used as a data latch. When the select input is low, the output follows the input (the first data input) and when the select input is high, the output state is fed back through the second data input and is thus latched. The control signal may be derived from logical combination of other signals.

The output section of the input/output module section of the present invention includes a two-input multiplexer having a first input connected to an internal data bus, and its output fed back to its second data input. Its select input is driven from a control signal. The output of the two-input multiplexer is also connected to the input of an HCT buffer. The output of the HCT buffer is connected to an I/O pad of the integrated circuit, which may be the same pad to which the input section is connected.

The slew input of the HCT buffer is driven from a signal enabling slow or fast rise times. The enable input of the HCT buffer is driven from an enable signal which may be derived from other logic signals.

BRIEF DESCRIPTION OF THE DRAWINGS

The FIGURE is a block diagram of an input/output logic module according to a presently preferred embodiment of the invention.

DETAILED DESCRIPTION OF A PREFERRED EMBODIMENT

Figure 1:
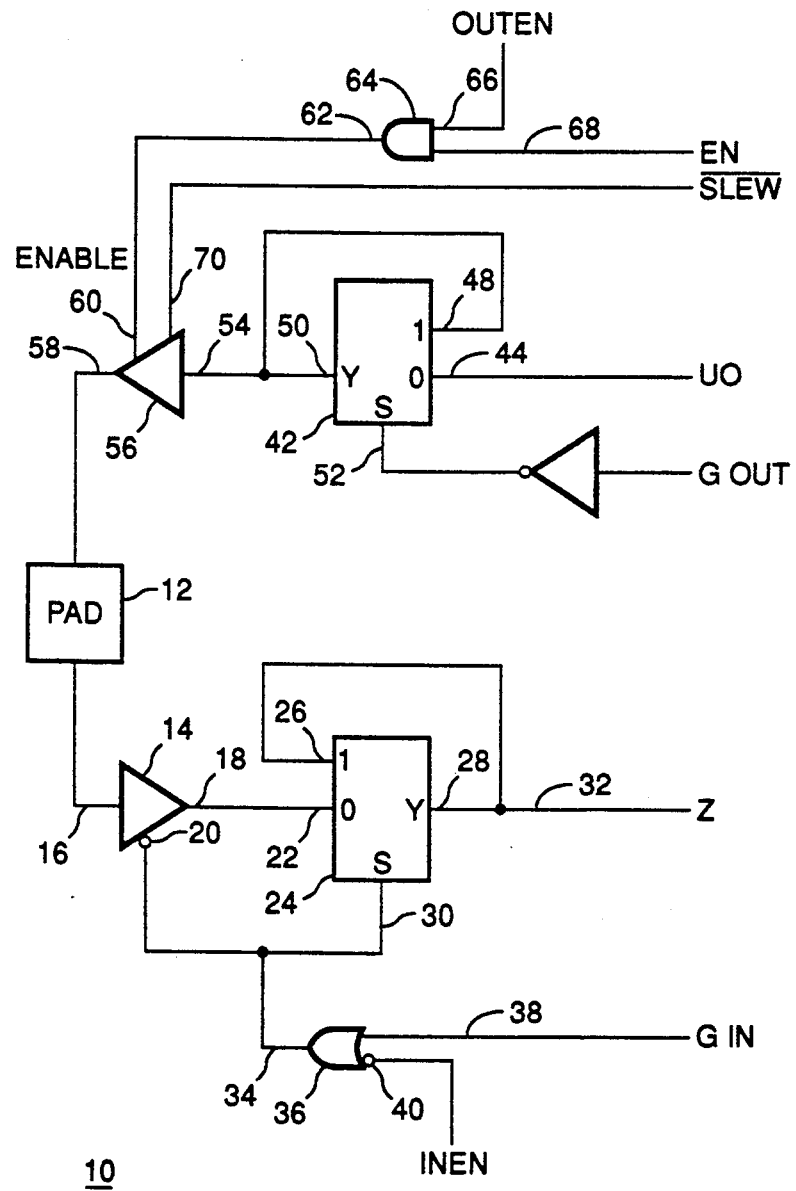

Referring to the FIGURE, a presently preferred input/output module 10 according to the present invention, it can be seen that module 10 communicates with input/output pad 12, through which all signals pass to and from the integrated circuit which contains input/output module 10.

The input portion of input/output module 12 includes input buffer 14, having input 16, output 18 and enable input 20. Enable input 20 of input buffer 14 allows the output of input buffer 14 to be placed in a high impedance state, as is well known in the art. Input buffer 14 may be a level shifting buffer for translating logic levels between a logic family which is used to drive input/output pad 12 and the logic family used in input/output module 10, which is CMOS in a presently preferred embodiment.

Output 18 of input buffer 14 is connected to a first data input 22 of input two-input multiplexer 24. Input two-input multiplexer 24 has a second data input 26, which is connected to its output 28, and a select input 30. Select input 30 of input two-input multiplexer 24 is connected to enable input 20 of input buffer 14, which may be a level shifting buffer as is well known in the art. Output 28 of input two-input multiplexer 24 is connected to an output node 32, which may be an internal bus of the integrated circuit of which input/output logic module 10 is a part.

As will be apparent to those of ordinary skill in the art, input two-input multiplexer 24 is configured as a latch which, in a first state when the logic level at select input 30 is low, acts as a pass through device, and, in a second state, when select input is high, acts as a latch by feeding back output 28 through input 26.

Select input 30 of input two-input multiplexer 24 and enable input 20 of input buffer 14 are driven from output 34 of gate 36, shown as an OR gate with a non-inverted input 38 driven by a signal GIN and an inverted input 40 driven by a signal INEN.

The output section of input/output logic module 10 of the present invention includes an output two-input multiplexer 42, having a first data input 44, connected to an internal bus 46 in the integrated circuit which contains input/output logic module 10. A second data input 48 of output two-input multiplexer 42 is connected to its output 50. Those of ordinary skill in the art will realize that, like input two-input multiplexer 24, output two-input multiplexer 42 is configured as a latch which acts as a pass-through when the logic level on select input 52 is low and as a latch when the logic input on select input 52 is high.

The output 50 of output two-input multiplexer 42 is connected to the input 54 of output buffer 56. The output 58 of output buffer 56 is connected to input/output pad 12. Output buffer 56 has an enable input 60 which may be used, as is well known in the art, to place output 58 of output buffer 56 in a high impedance state so that input/output pad 12 may drive input buffer 14 without bus contention. Enable input 60 of output buffer 56 is driven by output 62 of gate 64. In a presently preferred embodiment, gate 64 is an AND gate having inputs 66 and 68. Input 66 is driven by a signal OUTEN and input 68 is driven by a signal EN.

The two-input multiplexers and other logic elements disclosed herein may be fabricated using conventional MOS and CMOS technology.

In a presently preferred embodiment, output buffer 56 also has a slew input 70, which allows selection of a fast or slow slew rate for the signal at the output 58 of output buffer 56. Circuits for slew rate adjustment are well known in the art. In a presently preferred embodiment, the slew rate circuit should be designed so as to set the fast rate at about 0.6 volts/nanosecond fall time and to set the slow slew rate at about 0.3 volts/nanosecond for driving a 50 pF load.

The input and output sections of the input/output logic module of the present invention may be controlled so as to allow flexibility for the user. The slew rate may be set by tying the slew rate input select line to $V_{DD}$ or to ground. Connecting the GIN input to $V_{DD}$ disables the input buffer, assuming that the INEN input is connected to ground. Connecting the EN input to ground disables the input buffer, assuming that the OUTEN input is held at $V_{DD}$. Tying the GIN and EN inputs together to an internal driver or other I/O pad results in a an I/O control allowing the pad 12 to be selectively used for both input and output functions. Output enable signal OUTEN and input enable signal INEN may be used for controlling the input or output function for other purposes, such as testing.

While presently-preferred embodiments of the present invention have been disclosed herein, those of ordinary skill in the art will be enabled, from the within disclosure, to configure embodiments which although not expressly disclosed herein nevertheless fall within the scope of the present invention. It is therefore, the intent of the inventors that the scope of the present invention be limited only by the appended claims.

What is claimed is:

1. An input/output logic module for use in an integrated circuit, including:

an input/output node for said integrated circuit, an input buffer having an input connected to said input/output node, an enable input, and an output, said input buffer responsive to a signal on said enable input for placing said output in a high impedance state, an input two-input multiplexer having a first data input connected to the output of said input buffer, a second data input, a select input, and an output, said output connected to said second data input and to a first internal bus of said integrated circuit, means for driving said enable input from signals from said integrated circuit, means for driving said select input from signals from said integrated circuit.

2. An input/output logic module for use in an integrated circuit, including:

an input/output node for said integrated circuit, an output two-input multiplexer having a first data input connected to a second internal bus of said integrated circuit, a second data input, a select input, and an output, said output connected to said second data input, an output buffer having an input connected to said output of said output two-input multiplexer, an output connected to said input/output node, and an enable input, means for driving said enable input from signals from said integrated circuit, means for driving said select input from signals from said integrated circuit.

3. An input/output logic module for use in an integrated circuit, including:

an input/output node for said integrated circuit, an input buffer having an input connected to said input/output node, an input buffer enable input, and an output, said input buffer responsive to a signal on said enable input for placing said output in a high impedance state, an input two-input multiplexer having a first data input connected to the output of said input buffer, a second data input, a select input, and an output, said output connected to said second data input and to a first internal bus of said integrated circuit, means for driving said input buffer enable input from signals from said integrated circuit, means for driving the select input of said input two-input multiplexer from signals from said integrated circuit, an output two-input multiplexer having a first data input connected to a second internal bus of said integrated circuit, a second data input, a select input, and an output, said output connected to said second data input, an output buffer having an input connected to said output of said output two-input multiplexer, an output connected to said input/output node, and an output buffer enable input, means for driving said output buffer enable input from signals from said integrated circuit, means for driving said select input of said output two-input multiplexer from signals from said integrated circuit.

* * * * *